US006639831B1

United States Patent
Pancholy et al.

(10) Patent No.: US 6,639,831 B1
(45) Date of Patent: Oct. 28, 2003

(54) LOCALIZED MRAM DATA LINE AND METHOD OF OPERATION

(75) Inventors: Ashish Pancholy, Milpitas, CA (US); Jerome S. Wolfman, Parmain (FR)

(73) Assignee: Silicon Magnetic Systems, San Jose, CA (US)

( * ) Notice: Subject to any disclaimer, the term of this patent is extended or adjusted under 35 U.S.C. 154(b) by 0 days.

(21) Appl. No.: 10/321,035

(22) Filed: Dec. 17, 2002

(51) Int. Cl.$^7$ ................................................ G11C 11/00
(52) U.S. Cl. ....................................... 365/158; 365/171
(58) Field of Search ................................ 365/158, 171, 365/173, 145

(56) References Cited

U.S. PATENT DOCUMENTS 6,055,178 A  *  4/2000  Naji ............................ 365/158
6,272,040 B1 *  8/2001  Salter et al. ................. 365/158

* cited by examiner

Primary Examiner—Vu A. Le

(74) Attorney, Agent, or Firm—Kevin L. Daffer; Conley Rose P.C.

(57) ABSTRACT

A memory array is provided that includes a conductive line adapted to induce a magnetic field around less than all of the magnetic memory junctions arranged along a row or a column of the array. In some cases, the conductive line may be adapted to induce a magnetic field around more than two magnetic memory cell junctions. Alternatively, the conductive line may be adapted to induce a magnetic field around no more than two magnetic memory cell junctions. In either case, the conductive line may include a first portion vertically aligned with one of a plurality of magnetic memory cell junctions and a second portion vertically aligned with another of the plurality of magnetic memory cell junctions. In some embodiments, the second portion may be positioned such that a direction of current flow through the second portion is different than a direction of current flow through the first portion.

20 Claims, 2 Drawing Sheets

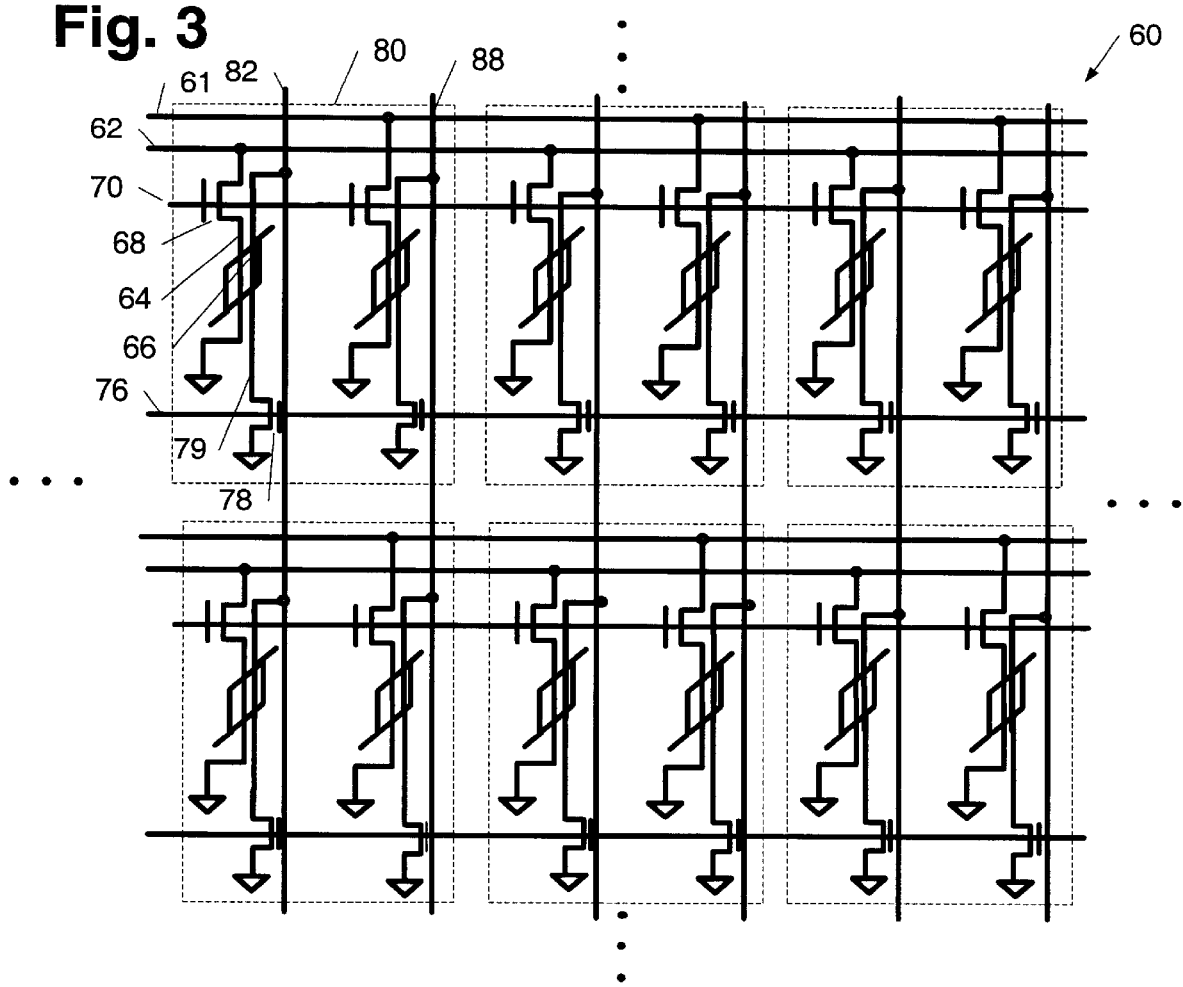

LOCALIZED MRAM DATA LINE AND METHOD OF OPERATION

BACKGROUND OF THE INVENTION

1. Field of the Invention

This invention relates to magnetic memory arrays and, more particularly, to data line configurations within magnetic memory cells.

2. Description of the Related Art

The following descriptions and examples are given as background information only.

Recently, advancements in the use of magnetoresistive materials have progressed the development of magnetic random access memory (MRAM) devices to function as viable non-volatile memory circuits. In general, MRAM circuits exploit the electromagnetic properties of magnetoresistive materials to set and maintain information stored within individual magnetic memory cell junctions of the circuit. In particular, MRAM circuits utilize magnetization direction to store information within a magnetic junction, and differential resistance measurements to read information from the magnetic junction. In general, an MRAM circuit includes one or more conductive lines with which to generate magnetic fields such that the magnetization directions of one or more magnetic junctions of the MRAM circuit may be set. Consequently, in some embodiments, the conductive lines may be referred to as "field-inducing lines."

Typically, the conductive lines are formed as substantially straight and uniform structures of metal spaced parallel and perpendicular to each other within a plane comprising the magnetic cell junctions. In other words, the conductive lines are generally arranged in series of columns and rows having magnetic junctions interposed at the overlap points of the conductive lines. In this manner, the circuit may include a plurality of memory cells arranged within an array. In some cases, the conductive lines may be referred to as "bit" and "digit" lines. In general, "bit" lines may refer to the conductive lines that are arranged in electrical contact with magnetic junctions. "Digit" lines, on the other hand, may refer to the conductive lines spaced vertically adjacent to the magnetic junctions and, therefore, are not arranged in electrical contact with the magnetic junctions. In general, bit lines are used for both the write and read operations of the array, while the digit lines are used primarily during write operations of the array.

In general, an individual magnetic junction can be written to by applying current simultaneously along a bit line and a digit line corresponding to the particular magnetic junction. Such an individual magnetic junction may herein be referred to as a selected magnetic junction, or the magnetic junction intentionally targeted for a writing procedure. During the writing procedure, however, the multitude of other magnetic junctions arranged vertically adjacent to the bit line and the digit line corresponding to the selected junction will also sense current. Such magnetic junctions are herein referred to as half-selected junctions, or disturbed junctions since the magnetic field induced about them is generated from one field-inducing line rather than two field-inducing lines. Even though less effective magnetic field is applied to these disturbed cells, variations within the magnetic junctions may allow the magnetic field induced by one current carrying line to switch the magnetization directions of one or more of the disturbed cells. In this manner, the write selectivity of the array may be reduced. Write selectivity, as used herein, may refer to the relative difference (i.e., current margin) between the amount of current responsible for switching the magnetization of a disturbed cell and the amount of current needed to switch the magnetization of a selected cell. Consequently, a reduction in write selectivity reduces the tolerance of the current used to reliably switch selected cells without switching disturbed cells within an array. In some cases, the tolerance may too small, allowing a false bit to be unintentionally written to one or more of the disturbed cells and in turn, decreasing the functionality of the array.

In addition, the number of memory cells arranged within an array may be limited by the arrangement of the conductive lines spanning across the columns and rows of the array. In general, the voltage required to generate a desired amount of current along a conductive line increases as the length of a conductive line increases, due to the current-resistance (IR) drop along the line. Since it is desirable to limit the overall power requirements of an array and, therefore, the amount of voltage used to operate the array, the conductive lines are generally restricted in length. In addition, the maximum voltage that may be used to operate an array may be restricted by the voltage supply coupled to the array, independent of the length of the conductive lines. Consequently, the number of magnetic junctions within an array is limited. In some cases, such a restriction causes the desired number of cells for a memory chip to be arranged within multiple arrays. Such an arrangement of cells, however, undesirably occupies a larger area of the wafer, increasing the size of the chip. As a result, fewer chips may be fabricated on the wafer, causing fabrication costs to increase and production throughput to decrease.

Therefore, it would be advantageous to develop a magnetic memory array with a configuration that reduces the effect of IR drop on the size of a memory array. In particular, it may be advantageous to fabricate a magnetic memory array with a configuration that eliminates IR drop as a limiting factor for the number of memory cells arranged along at least one dimension of an array. Such an array may advantageously increase the density of memory cells, thereby increasing the number of chips fabricated on a wafer of a particular size. In addition, it would be advantageous to develop a magnetic memory array with a configuration that increases the write selectivity of a magnetic memory array. More specifically, it would be advantageous to develop a magnetic memory array with a configuration that eliminates the issue of write selectivity.

SUMMARY OF THE INVENTION

The problems outlined above may be in large part addressed by a memory array that includes a conductive line adapted to induce a magnetic field around less than all of the magnetic memory junctions arranged along a row or a column of the array. In particular, the memory array may be adapted to selectively enable current to flow to the conductive line and one or more additional conductive lines aligned along a single row or column of the array comprising the conductive line. In this manner, the conductive line may be arranged adjacent to less than all of the magnetic junctions arranged along a row or column of the array. In other words, although each of the magnetic cell junctions of the array may be arranged adjacent to at least one respective field-inducing line with which to set the logic states of the junctions, not all of the magnetic cell junctions arranged along a single row or column are necessarily arranged adjacent to the same field-inducing line. In this manner, the memory array may include a plurality of field-inducing lines arranged along a single row or column of the array.

In some embodiments, the conductive line may be adapted to induce a magnetic field around more than two magnetic memory cell junctions. Alternatively, the conductive line may be adapted to induce a magnetic field around no more than two magnetic memory cell junctions. For example, the conductive line may be adapted to induce a magnetic field around a differential pair of magnetic memory cell junctions. In such an embodiment, the conductive line may be adapted to induce a relatively high level of resistance within one magnetic memory cell junction and a relatively low level of resistance within another magnetic memory cell junction. In other cases, the conductive line may be adapted to induce a magnetic field around magnetic memory cell junctions of a single memory array in which the resistance of individual magnetic memory cell junctions are compared to a common reference cell arranged along a row or column of the array. In either case, the conductive line, in some embodiments, may be configured to induce a magnetic field exclusively around the magnetic memory cell junctions of a single memory cell.

In some cases, the conductive line may include a first portion vertically aligned with one of a plurality of magnetic memory cell junctions arranged along a row of the memory array and a second portion vertically aligned with another of the plurality of magnetic memory cell junctions. In some embodiments, the second portion may be positioned such that a direction of current flow through the second portion is different than a direction of current flow through the first portion. More specifically, the second portion may be positioned such that the direction of current flow through the second portion is at an angle less than or equal to approximately 180° relative to the direction of current flow through the first portion. In some cases, the direction of current flow through the second portion may be at an angle between approximately 60° and approximately 120° relative to the direction of current flow through the first portion. More particularly, the direction of current flow through the second portion may be approximately 90° relative to the direction of current flow through the first portion in some cases. In addition or alternatively, the direction of current flow through the first portion may be arranged between easy and hard axes of the magnetic memory cell junction aligned with the first portion. Similarly, the direction of current flow through the second portion may be addition or alternatively arranged between easy and hard axes of the magnetic memory cell junction aligned with the second portion.

In general, the conductive line described herein may be configured to induce a magnetic field that changes the overall direction of a plurality of magnetic vectors arranged in an equilibrium state within a magnetic junction of the memory array. In particular, the conductive line may be arranged in electrical contact with some of the magnetic cell junctions of the memory array and, therefore, may serve as a bit line in some embodiments. Alternatively, the conductive line may serve as a digit line and be vertically spaced from the magnetic cell junctions of the memory array. In some embodiments, the conductive line may be further adapted to induce a magnetic field that changes the overall direction of a plurality of magnetic vectors arranged in an equilibrium state within another magnetic junction of the memory array. In such an embodiment, the magnetic junctions switched by the magnetic field may include a differential pair of magnetic memory junctions. Consequently, the conductive line may be adapted to set magnetic memory cell junctions in different logic states than each other.

A method for operating a magnetic memory array is also contemplated herein. In particular, the method may include flowing current in alignment with a dimension of the magnetic memory array and adjacent to less than all of the magnetic memory cell junctions arranged along a row or a column of the array aligned with the dimension. More specifically, the method may include enabling current flow from a source line to a conductive line aligned with the row or column of the array. Such a step of flowing current may be during a write operation and/or a read operation of the memory array. In some embodiments, the memory array may include a transistor adapted to enable current flow through the conductive line during such an operation. In particular, the step of enabling current flow for the method described herein may include applying voltage to a gate of a transistor coupled to the conductive line during a write operation of the memory array. In some cases, the memory array described herein may further include an additional transistor adapted to enable current flow from the conductive line through the magnetic junction during a read operation of the memory array. As such, the method described herein may include applying voltage to a gate of the additional transistor of the memory array during a read operation of the array.

There may be several advantages for fabricating the memory array described herein. In particular, the arrangement of a field-inducing line adjacent to less than all of the magnetic junctions aligned along a single row or column of a memory array may advantageously allow a higher density memory array to be fabricated. More specifically, the arrangement of several conductive lines along a single row or column of an array may negate IR drop as a limiting factor for the number of cells fabricated along one dimension of a memory array. Consequently, a higher density memory cell array may be fabricated. In addition, the reliability of magnetic memory arrays may be improved by the configuration of the conductive line described herein. More specifically, write selectivity of cells within an array may be increased, improving the reliability of the array.

BRIEF DESCRIPTION OF THE DRAWINGS

Other objects and advantages of the invention will become apparent upon reading the following detailed description and upon reference to the accompanying drawings in which:

FIG. 3 depicts a partial electrical schematic diagram of a partial magnetic memory array with a different configuration; and FIG. 4 depicts a flowchart for a method of operation for a magnetic memory array.

Figure 1:
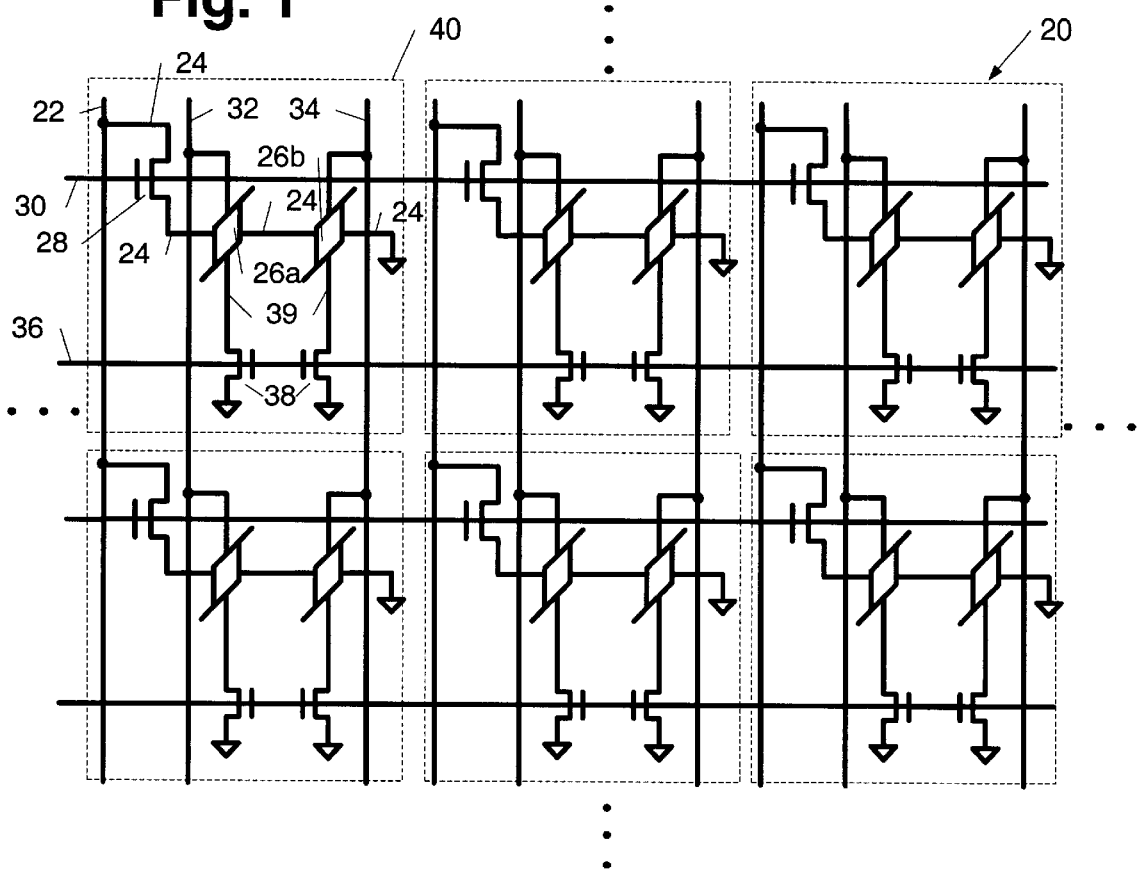
FIG. 1 depicts an electrical schematic diagram of a partial magnetic memory array.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning to the drawings, exemplary embodiments of magnetic memory arrays and magnetic cell junctions are provided. In addition, an exemplary method for operating such memory arrays is provided. FIG. 1 depicts an electrical schematic diagram of partial memory array 20 including conductive line 24 adapted to induce a magnetic field around less than all of the magnetic memory junctions arranged along a row of array 20. In other embodiments, memory array 20 may be alternatively adapted to induce a magnetic field around less than all of the magnetic memory cell junctions along a column of the array. An embodiment including such a configuration is described in more detail below in reference to FIG. 3. As shown in FIG. 1, conductive line 24 may be coupled to current source line 22 and routed through transistor 28 to ground after passing by magnetic cell junctions 26a and 26b. In this manner, conductive line 24 may be adapted to induce a magnetic field around less than all of the magnetic memory cell junctions along the row of the array. In particular, conductive line 24 may be adapted to induce a magnetic field exclusively about magnetic memory cell junctions 26a and 26b. In some embodiments, however, conductive line 24 may be adapted to induce a magnetic field exclusively around one magnetic cell junction of array 20. In yet other embodiments, conductive line 24 may be adapted to induce a magnetic field about more than two magnetic junctions arranged along a row of memory array 20.

In general, the function of conductive line 24 may be to contribute to the generation of a magnetic field about a selected memory cell during a write operation of memory array 20. As shown in FIG. 1, memory array 20 may further include bit line 32 and bit line bar 34 with which to induce a magnetic field about a selected memory cell during a write operation of memory array 20. Consequently, conductive line 24 may serve as a digit line in some embodiments. In particular, conductive line 24 may be arranged vertically spaced from magnetic memory cell junctions 26a and 26b. In alternative embodiments, conductive line 24 may be adapted to serve as a bit line of memory array 20, in addition to bit line 32 and bit line bar 34. More specifically, conductive line 24 may be arranged in electrical contact with magnetic memory cell junctions 26a and 26b. In this manner, magnetic memory cell junctions 26a and 26b may each be arranged in electrical contact with two bit lines. In such an embodiment, one of the bit lines may be used for the read operations of the array, while the other or both of the bit lines may be used for the write operations of the array. An exemplary illustration of such an embodiment is depicted in FIG. 3 and described in more detail below. In any case, the length of conductive line 24 may be restricted such that the effect of the IR drop along the line is reduced to a level which does not influence the voltage at which to operate memory array 20. More specifically, the length of conductive line 24 may be restricted such that the IR drop of the line does not act as a limiting factor for the number of magnetic junctions arranged along a row of memory array 20. Consequently, the number of cell junctions within the memory array described herein may be larger than the number of cell junctions included in conventional arrays.

As shown in FIG. 1, memory array 20 may include a plurality of other conductive lines and devices associated and aligned along the rows and columns of the array. In particular, memory array 20 may include transistor 28, current source line 22, and select line 30 which are adapted to enable current flow through conductive line 24. In addition, memory array 20 may include word line 36, transistors 38, and series of contact structures 39 which are adapted to enable a read operation of the array. Such a plurality of components is outlined by a dotted line in FIG. 1 indicating an arbitrary boundary of memory cell 40. As illustrated in FIG. 1, boundaries of other magnetic memory cells within memory array 20 are also outlined by dotted lines. In general, each of the memory cells of memory array 20 may include substantially similar components. Therefore, the description of the components within memory cell 40 as described above may pertain to each of the memory cells of the array. It is noted that the dotted lines illustrated in FIG. 1 are merely illustrated to distinguish the arrangement of memory cells within the array and to describe components of the memory cells. Therefore, the dotted lines outlining the periphery of the magnetic cells are not included within the circuit and do not serve a function for the circuit. In addition, the placement of the dotted-line boundary is arbitrary and therefore, the size of the memory cell is not restricted to the dotted line itself.

Furthermore, although the magnetic memory cells outlined in FIG. 1 are shown to include a differential pair of magnetic cell junctions, the memory cells of the array described herein are not restricted to such a configuration. In particular, the memory array described herein may be included in differential memory cell arrays or single cell memory arrays. As such, the dotted lines within FIG. 1 should not restrict the type of memory cell array that may be fabricated with the configuration described herein. In general, differential memory cell arrays are configured such that a differential resistance measurement may be obtained between two magnetic junctions of an individual memory cell during a read operation of the memory array. On the other hand, a single memory array may be configured such that a differential resistance measurement may be obtained between the magnetic junction of a memory cell and a magnetic junction of one or more reference cells arranged along the same row of the array. Consequently, in some embodiments, the dotted lines of memory array 20 may be arranged around the circuitry of a single magnetic cell junction to define the boundary of a single memory cell. In either case, the size of memory array 20 may depend on the size of the memory array components. Therefore, although FIG. 1 only illustrates an array within two rows and three columns, memory array 20 may include any number of rows and columns of magnetic memory cell junctions as indicated by the continuation dots arranged along the periphery of memory array 20.

As noted above, memory array 20 may include transistor 28, current source line 22, and select line 30 with which to enable current flow through conductive line 24. In particular, transistor 28 may be adapted to enable current flow from current source line 22 to conductive line 24 by the application of voltage along select line 30. In this manner, current source line 22 may be adapted to supply current with which to write to magnetic cell junctions 26a and 26b. Moreover, current source line 22 may be coupled to one or more additional conductive lines aligned with other rows of memory array 20. In addition or alternatively, current source line 22 may be coupled to one or more additional conductive lines arranged within the row which include magnetic cell junctions 26a and 26b. In this manner, memory array 20 may be adapted to selectively supply current from source line 22 to conductive line 24 and one or more additional conductive lines arranged within the array. In general, the induction of current through conductive line 24 may be used for the write operations of the array. Consequently, it is noted that transistor 28 is distinct from transistors 38. In particular, transistor 28 may be used to conduct current adjacent to the magnetic cell junctions and thus, may be used for the write operation of the memory cell. Transistors 38, however, may be used for the read operation of the array and therefore, may be used to enable current flow though the magnetic cell junctions. In particular, transistors 38 may be adapted to enable current flow from conductive line 24 through magnetic cell junctions 26a and 26b and series of contact structures 39 by the application of voltage along word line 36 for the read operations of the array.

Figure 2:
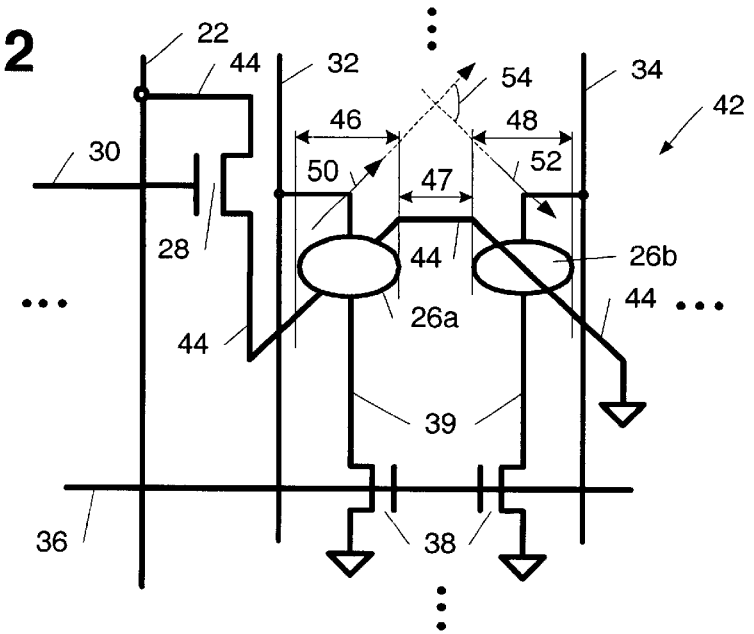
FIG. 2 depicts an electrical schematic diagram of an alternative magnetic memory cell configuration for the magnetic memory array depicted in FIG. 1.

Although FIG. 1 illustrates conductive line 24 having a substantially straight and uniform configuration above magnetic cell junctions 26a and 26, conductive line 24 may be configured in several different manners. For example, FIG. 2 illustrates an alternative memory cell configuration for memory cell array 20. In particular, FIG. 2 illustrates memory cell 42 including conductive line 44 having a different pattern configuration than conductive line 24 of memory cell 40 in FIG. 1 as described in more detail below. As shown in FIG. 2, memory cell 42 may include magnetic cell junctions 26a and 26b, current source line 22, transistors 28 and 38, select line 30, bit line 32, bit line bar 34, word line 36, and series of contact structures 39. Such components may be similar to the components which share the same respective reference numbers within memory cell 40 of FIG. 1. As such, transistors 38 may be adapted to enable current flow from a conductive line of the memory cell through magnetic cell junctions 26a and 26b by the application of voltage along word line 36 for the read operations of memory array 42. In addition, transistor 28 may be adapted to enable current flow from source line 22 to the conductive line of the memory cell through the application of voltage along select line 30. Furthermore, bit line 32 and bit line bar 34 may be arranged in electrical contact with magnetic cell junctions 26a and 26b, respectively.

As noted above, however, memory cell 42 differs from memory cell 40 by the configuration of the conductive line arranged adjacent to both magnetic cell junctions 26a and 26b. In particular, memory cell 42 includes conductive line 44, rather than conductive line 24, aligned with and adapted to induce a magnetic field about magnetic cell junctions 26a and 26b. Similar to conductive line 24, conductive line 44 is coupled to current source line 22 and routed through transistor 28 to ground after passing by magnetic cell junctions 26a and 26b. In this manner, conductive line 44 is adapted to induce a magnetic field around less than all of the magnetic junctions arranged along a row of memory array 20. However, the pattern layout of conductive line 44 is distinctly different than conductive line 24. In particular, the portion of conductive line 24 adjacent to and between magnetic cell junctions 26a and 26b within memory cell 40 of FIG. 1 is straight and uniform. In contrast, the portion of conductive line 44 adjacent to and between magnetic cell junctions 26a and 26b within memory cell 42 of FIG. 2 includes segments which do not form a straight and uniform structure.

In particular, conductive line 44 includes portion 46 aligned with magnetic cell junction 26a and portion 48 aligned with magnetic cell junctions 26b, which are positioned such that directions of current flow through the portions are different from each other. More specifically, portion 46 of conductive line 44 may include direction of current flow 50, while portion 48 may include direction of current flow 52 when current flow is induced from left to right through the conductive line. Alternatively, portions 46 and 48 may have directions of current flows which are opposite from directions of current flows 50 and 52, respectively, when current flow is induced from right to left through the conductive line. In either case, conductive line 44 may also include portion 47 connecting portions 46 and 48. In some embodiments, portion 47 may include a substantially straight, single line as shown in FIG. 2. However, portion 47 may be fabricated in a variety of patterns. For example, portion 47 may be include a pattern which joins portions 46 and 48 in an apex between magnetic junctions 26a and 26b. In general, portion 47 may include any configuration which connects portions 46 and 48. As such, configurations of conductive line 44 other than the one shown in FIG. 2 may be alternatively arranged within memory cell 42, in some embodiments.

As shown in FIG. 2, angle 54 may represent the change in direction between directions of current flow 50 and 52. Consequently, angle 54 may represent a difference in alignment between portions 46 and 48. In this manner, the positions of portions 46 and 48 may be referenced relative to each other by the measurement of angle 54. In general, angle 54 may be less than or equal to approximately 180°. More specifically, angle 54 may be between approximately 60° and approximately 120° in some cases. In some embodiments, it may be advantageous to fabricate conductive line 44 to with angle 54 at approximately 90°. For example, an angle of approximately 90° defining the arrangement of portions 46 and 48 may be advantageous in a differential memory cell array. In particular, conductive line 44 having portions positioned such that their respective directions of current flow are approximately 90° relative to each other may allow magnetic fields with different directions to be induced around magnetic cell junctions 26a and 26b. In any case, conductive line 44 may be adapted to induce magnetic fields which changes the magnetization of magnetic cell junctions 26a and 26b. More specifically, conductive line 44 may be adapted to induce a different magnetic field around magnetic cell junction 26a than magnetic cell junctions 26b. In this manner, such a configuration may allow opposite bits to be written to magnetic cell junctions 26a and 26b, respectively.

In some cases, it may be advantageous to orient portions 46 and 48 of conductive line 44 to optimize the switching mechanisms of magnetic cell junctions 26a and 26b. For example, portions 46 and 48 may be oriented such that current flow through the portions is directed between the easy and hard axes of the magnetic cell junctions in some embodiments. In this manner, the configuration of conductive line 44 may simulate the direction of an aggregate magnetic field that may be generated between two field-inducing lines which are oriented perpendicular to each other as in conventional array configurations. In general, the internal magnetic field within a magnetic layer is directed along a plurality of individual magnetic vectors, the vector sum of which determines the overall magnetic direction of the layer. In cases in which no external field is applied to the layer, the vector pattern may be referred to as an equilibrium vector state. Since substantially no external energy is required to produce such an equilibrium vector state, the direction represented by the vector sum of the individual magnetic vectors in such a state may be designated as the "easy axis" of magnetization. On the other hand, a "hard axis" of magnetization may be designated as the direction that requires the largest external field to maintain a vector pattern state in between two easy axes of magnetization.

In general, magnetic vectors existing within an equilibrium state of a layer may be more easily changed with a magnetic field which is not directly parallel with the magnetic vectors. In this manner, it is generally desirable to induce a magnetic field which is not aligned with the easy axis of the junction in order to alter the overall magnetization direction of the magnetic cell junction from its equilibrium state. As such, it may be advantageous to orient portions 46 and 48 of conductive line 44 such that current flow through the portions is not directed along the easy axes of magnetic cell junctions 26a and 26b, respectively. In some embodiments, easy and hard axes orientations may be dependent on the shape of the magnetic cell junction. For example, in some embodiments, a magnetic cell junction may be fabricated to have an elliptical shape.

Since the innate alignment of magnetic vectors within a layer may, in some embodiments, follow the shape of the layer, the magnetization direction of layers within an elliptically shaped magnetic junction may, in some embodiments, align with the elongated dimension of the cell junction when no external field is applied. Consequently, in some embodiments, the elongated dimension of an elliptically shaped cell junction may be referred to as the easy axis of the junction. In other cases, however, other directions along an elliptically shaped magnetic cell junctions may additionally or alternatively be referred to as easy axes of magnetization, depending the materials used within the junctions and/or the process used to fabricate the junctions as noted below. As stated above, the hard axis of magnetization may be designated as the direction that requires the largest external field to maintain a vector pattern state in between two easy axes of magnetization. In some cases, maintaining the magnetic vectors in a direction that is substantially perpendicular to the easy axes of the junction may require the largest magnetic field between such axes. Consequently, in some embodiments, the shortened dimension of an elliptically shaped magnetic junction may be referred to as the hard axis of magnetization. Other directions along an elliptically shaped magnetic cell junctions, however, may additionally or alternatively referred to as hard axes of magnetization, depending on the design specifications of the array.

As such, in some embodiments and as shown in FIG. 1, magnetic cell junctions 26a and 26b may include elliptical shapes having elongated dimensions and shortened dimensions. Consequently, portions 46 and 48 of conductive line may be positioned relative to easy axes of magnetic cell junctions 26a and 26b, respectively. More specifically, portions 46 and 48 may be positioned such that the direction of current flow through the portions are not directed along the easy axes of magnetic cell junctions 26a and 26b, respectively. Alternatively stated, portions 46 and 48 may be positioned such that they are not aligned with the elongated dimensions of magnetic cell junctions 26a and 26b, respectively. In some embodiments, portion 46 may be positioned such that direction of current flow 50 may be arranged between the easy and hard axes of magnetic cell junction 26a. More specifically, portion 46 may be positioned such that direction of current flow 50 may be arranged between the elongated and shortened dimensions of magnetic cell junction 26a. Similarly, portion 48 may be positioned such that direction of current flow 52 may be arranged between the easy and hard axes of magnetic cell junction 26b or, in other words, between the elongated and shortened dimension of magnetic cell junctions 26b. In yet other embodiments, portions 46 and/or 48 may be positioned such that directions of current flows 50 and/or 52 are arranged along the easy or hard axes of magnetic cell junctions 26a and 26b. In this manner, portions 46 and 48 may be aligned relative to any direction of magnetic cell junctions 26a and 26b, depending on the design specifications of the array.

In some embodiments, characteristics other than the shape of the magnetic junction may contribute to the equilibrium vector state of the junction. For example, in some cases, the direction of the equilibrium vector state of the magnetic junction may be additionally or alternatively dependent on the material composition or the chemical nature of the magnetic layers within the magnetic junction. In other cases, the equilibrium vector state may be additionally or alternatively formed by inducing an external field while forming or annealing the magnetic junction. In this manner, an elliptically shaped magnetic junction may be configured to have easy and/or hard axes along directions other than the elongated and shortened dimensions of the magnetic junction. In addition or alternatively, a magnetic junction may be configured to have one or more easy and/or hard axes. In yet other embodiments, a magnetic cell junction may not include easy and hard axes of magnetization. As such, although configuration of conductive line 44 is sometimes described in reference to the easy and hard axes magnetic cell junctions 26a and 26b, the configuration of conductive line 44 is not restricted to such directions of the magnetic cell junctions.

In addition, it is noted that although the description of manipulating logic states within magnetic junction provided herein is directed at elliptically shaped magnetic junctions, other shapes known in the MRAM fabrication industry may also or alternatively be used to promote easy and hard axes orientations within magnetic layers of cell junctions. Therefore, although configuration of conductive line 44 is sometimes described in reference to the elongated and shortened dimensions magnetic cell junctions 26a and 26b, the configuration of conductive line 44 is not restricted to such dimensions of the magnetic cell junctions. In fact, in some embodiments, magnetic cell junctions 26a and 26b may not include elongated or shortened dimensions. Consequently, the embodiment depicted in FIG. 2 is not restricted to elliptically shaped magnetic cell junctions. In particular, the magnetic memory array configuration described herein may be incorporated with magnetic cell junctions of any shape and/or size.

Similar to conductive line 24 of FIG. 1, conductive line 44 may serve as a digit line of memory cell 42 in some embodiments. As such, conductive line 44 may be vertically spaced from magnetic cell junctions 26a and 26b. In such an embodiment, memory cell 42 may be configured as a differential memory cell or a single memory cell, since the alternating orientation of portions 46 and 48 along conductive line 44 may not affect whether opposite bits are written to magnetic cell junctions 26a and 26b when conductive line is a digit line. Consequently, in some embodiments, conductive line 44 may not be configured to write bits of opposite values to magnetic cell junctions 26a and 26b. In yet other embodiments, conductive line 44 may serve as a bit line of memory cell 42 and, therefore, be arranged in electrical contact with magnetic cell junctions 26a and 26b.

In this manner, magnetic memory cell junctions 26a and 26b may each be arranged in electrical contact with two bit lines. In particular, conductive line 44 may be coupled to both junctions and; bit line 32 and bit line bar 34 may be coupled respectively to junctions 26a and 26b. In such an embodiment, conductive line 44 may be used solely for the write operations of the array since it is directed to ground after passing by magnetic cell junctions 26a and 26b. In contrast, however, bit lines 32 and 34 may be used for the write and/or read operations of the array. In such an embodiment, bit line 32 and bit line 34 may be arranged relative to any direction of magnetic cell junctions 26a and 26b. In particular, bit line 32 and bit line bar 34 may be configured such that current flow through the lines is directed in a substantially perpendicular manner to the easy axes of magnetic cell junctions 26a and 26b, respectively, as shown in FIG. 2. Alternatively, bit line 32 and bit line bar 34 may be configured such that current flow through the lines is directed in a substantially perpendicular manner to the hard axes of magnetic cell junctions 26a and 26b, respectively. In yet other embodiments, bit line 32 and bit line bar 34 may be configured such that current flow through the lines is directed in a manner that is between the easy and hard axes of magnetic cell junctions 26a and 26b.

In addition, the length of conductive line 44 may be restricted such that the effect of the IR drop along the line is reduced to a level which does not influence the voltage at which to operate memory array 20. More specifically, the length of conductive line 44 may be restricted such that the IR drop of the line does not act as a limiting factor for the number of magnetic junctions arranged along one dimension of memory array 20. In this manner, the size of memory array 20 may not be limited by the IR drop of the conductive lines arranged adjacent to the magnetic cell junctions of a row of the array. Consequently, the number of cell junctions within an array having a configuration similar to conductive line 44 may be larger than the number of cell junctions included in conventional arrays. Such a configuration may lend the memory array described herein to have a lower number of disturbed magnetic junctions along a row of the array during a write operation of the array as compared to conventional memory array configurations. In particular, conductive line 44 may be adapted to induce a magnetic field around less than all of the magnetic cell junctions arranged along the row, increasing the write selectivity of memory array 20 relative to conventional arrays. As a result, the reliability of the array described herein may be greater than an array having a conventional configuration. Alternatively, conductive line 44 may be configured to extend across an entirety of a row of memory array 20. In such an embodiment, however, the IR drop of the line may contribute to a limiting factor for the size of memory array 20.

An alternative exemplary embodiment of a magnetic memory array is illustrated in FIG. 3. In particular, FIG. 3 illustrates memory array 60 including conductive line 64 adapted to induce a magnetic field about less than all of the magnetic cell junctions arranged along a column of memory array 60. More specifically, FIG. 3 illustrates conductive line 64 configured to induce a magnetic field exclusively about magnetic cell junction 66. In other embodiments, however, conductive line 64 may be adapted to induce a magnetic field about-more than one magnetic junction arranged within the column of memory array 60 including magnetic cell junction 66. In either case, the length of conductive line 64 may be restricted such that the effect of the IR drop along the line is reduced to a level which does not influence the voltage at which to operate memory array 60. More specifically, the length of conductive line 64 may be restricted such that the IR drop of the line does not act as a limiting factor for the number of magnetic junctions arranged along one dimension of memory array 60. In this manner, the size of memory array 60 may not be limited by the IR drop of the conductive lines arranged adjacent to the magnetic cell junctions of a column of the array.

As shown in FIG. 3, memory array 60 may include a plurality of other conductive lines and devices associated and aligned along the rows and columns of the array. In particular, memory array 60 may include transistor 68, current source lines 61 and 62, and select line 70 which are adapted to enable current flow through conductive line 64. In addition, memory array 60 may include bit line 86, bit line bar 88, word line 76, transistor 78, and series of contact structures 39 which are adapted to enable a read operation of the array. Such a plurality of components is outlined by a dotted line in FIG. 3 indicating an arbitrary boundary of memory cell 80. As illustrated in FIG. 3, memory cell 80 may further include a duplicate set of such components. In particular, memory cell 80 may include one set of components coupled to current source line 61 and another set of components coupled to current source line 62. Such a memory cell configuration may be indicative of a differential memory cell. In particular, memory array 60 may be adapted to write opposite bits to the magnetic cell junctions within memory cell 80. In yet other embodiments, memory array 60 may be a single cell memory array. In such an embodiment, the memory cells within such an array may be bound by the circuitry surrounding one magnetic cell junction rather than two magnetic cell junctions. In addition, one of current source lines 61 and 62 may be omitted from such a configuration since writing opposite bits of information is not needed. In either case, each of the memory cells of memory array 60 may include substantially similar components. Therefore, the description of the components within memory cell 80 as described above may pertain to each of the memory cells of the array.

As noted above, memory array 60 may include transistor 68, current source lines 61 and 62, and select line 70 with which to enable current flow through conductive lines of memory cell array 60. In particular, transistor 68 may be adapted to enable current flow from current source line 61 to conductive line 64 by the application of voltage along select line 70. Likewise, the complementary set of components within memory cell 80 may be adapted to enable current flow from current source 62 to the complementary conductive line of memory cell 80. Moreover and as shown in FIG. 3, current source lines 61 and 62 may be coupled to one or more additional conductive lines arranged within the row which include magnetic cell junction 66. In addition or alternatively, current source lines 61 and/or 62 may be coupled to one or more additional conductive lines aligned with other rows of memory array 60. In this manner, memory array 60 may be adapted to selectively supply current from source lines 61 and 62 to the conductive lines within memory cell 80 and one or more additional conductive lines arranged within the array.

In general, conductive line 64 may be oriented in a variety of positions relative to magnetic cell junction 66. For example, conductive line 64 may be oriented such that current flow through the conductive line may be directed in a substantially perpendicular direction with respect to an easy axis of magnetic cell junction 66. In yet other embodiments, however, conductive line 64 may be oriented such that current flow through the conductive line is directed between easy and hard axes of magnetic cell junction 66. In any case, conductive line 64 may be adapted to contribute to the generation of a magnetic field about a selected memory cell for a write operation of the memory cell. In particular, in some cases, conductive line 64 may serve as a digit line of memory cell 80. As such, conductive line 64 may be vertically spaced from magnetic cell junction 66. In yet other embodiments, conductive line 64 may serve as a bit line of memory cell 80 and, therefore, be arranged in electrical contact with magnetic cell junction 66. In this manner, magnetic memory cell junction 66 may each be arranged in electrical contact with two bit lines. In particular, magnetic memory cell junction 66 may be coupled to both conductive line 64 and bit line 86. In such an embodiment, conductive line 64 may be used solely for the write operations of the array since it is directed to ground after passing by magnetic cell junction 66. In contrast, bit line 86 may be used for the write and/or read operations of the array. In any case, bit line 86 may be arranged relative to any direction of magnetic cell junction 66.

In some cases, memory array 60 may further include conductive lines, other than conductive line 64, which may serve as digit lines for the array. However, in an embodiment in which conductive line 64 is adapted to induce a magnetic field about one magnetic cell junction, the inclusion of digit lines may not be necessary. In particular, since each magnetic cell junction may be written to individually, the crosshatch pattern of bit lines and digit lines may not be necessary to identify a selected memory cell. Consequently, the write selectivity of an array with such a configuration may be increased or negated since other memory cells will not be disturbed by magnetic fields induced within adjacent bit lines or digit lines during the write operation of the array. As a result, the reliability of such an array may be greater than an array having a conventional configuration. In an alternative embodiment, however, conductive line 64 may be adapted to induce a magnetic field about more than one magnetic junction arranged along a column of memory array 60. In such an embodiment, additional conductive lines may be needed to serve as digit lines such that a particular memory cell may be selected for a write operation of the array.

A method detailing the operation steps of a memory array is shown FIG. 4. In particular, FIG. 4 illustrates a flow chart depicting write and read operations of a memory array having a configuration as described herein. As shown in FIG. 4, the method may include step 82 which involves flowing current in alignment with a dimension of a magnetic memory array and adjacent to less than all of the magnetic memory cell junctions arranged along a row or column of the array aligned within the dimension. Such a step may be particularly used for the write operation of the array. For example, the method of writing to magnetic cell junctions 26a and 26b in FIG. 1 or 2 may include flowing current through conductive line 24 or 44 such that a magnetic field may be induced to switch the magnetizations of the cell junctions. Similarly, the method of writing to magnetic cell junctions 66 in FIG. 3 may include flowing current through conductive line 64 such that a magnetic field may be induced to switch the magnetizations of the cell junctions.

In some embodiments, such a current flow may be induced by applying voltage to a gate of a transistor which is coupled between the conductive line and a current source line. For instance, current flow through conductive line 24 in FIGS. 1 and 2 may be induced by applying voltage to a gate of transistor 28. More specifically, transistor 28 may be adapted to enable current flow through conductive line 24 from current source line 22 upon the application of voltage along select line 30. In this manner, conductive line 24 may be adapted to program magnetic cell junctions 26a and 26b upon the application of a voltage to a gate of transistor 28. A similar induction of current flow from current source line 62 to conductive line 64 in FIG. 3 may be conducted by the application of voltage to a gate of transistor 78. It is noted that step 82 in FIG. 4 is distinct from the operation of conventional magnetic memory arrays. In particular, write operations of conventional magnetic memory arrays do not generally employ the use of a transistor to switch the magnetization direction of magnetic cell junctions.

As illustrated in FIG. 4, the method may further include step 84 in which voltage is applied to a gate of a different transistor of the memory array to enable current flow through at least one magnetic junction during a read operation of the array. For example, the method of reading from magnetic cell junctions 26a and 26b in FIGS. 1 and 2 may include applying a.voltage to the gates of transistors 38 which are adapted to enable current flow through magnetic cell junctions 26a and 26b upon the application of current through word line 36. Similarly, the method of reading from magnetic cell junction 66 in FIG. 3 may include applying a voltage to the gate of transistor 78, which is adapted to enable current flow from conductive line 62 through magnetic cell junction 66 upon the application of current through word line 76. In this manner, however, the memory cell of the magnetic memory array described herein may include at least two distinct transistors; one used for write operations and one or more used for read operations of the array.

It will be appreciated to those skilled in the art having the benefit of this disclosure that this invention is believed to provide a field-inducing line configuration within a memory cell and a method for writing to such a memory cell. Further modifications and alternative embodiments of various aspects of the invention will be apparent to those skilled in the art in view of this description. For example, the dimensions, angles, and configurations of the field-inducing lines described herein are not limited to the configurations provided in FIGS. 1–3. More specifically, any field-inducing line adapted to induce a magnetic field around less than all of the magnetic memory cell junctions arranged along a row or column of a memory array may be incorporated into the description included herein. It is intended that the following claims be interpreted to embrace all such modifications and changes and, accordingly, the specification and drawings are to be regarded in an illustrative rather than a restrictive sense.

What is claimed is:

1. A circuit, comprising:
   an array of magnetic memory cell junctions; and
   a conductive line arranged along a dimension of the array, wherein the conductive line is adapted to induce a magnetic field around less than all of the magnetic memory cell junctions arranged along a row or a column of the array aligned with the dimension.

2. The circuit of claim 1, wherein the conductive line is adapted to induce a magnetic field around no more than two aligned magnetic memory cell junctions.

3. The circuit of claim 2, wherein the conductive line is adapted to induce a higher level of resistance within one of the aligned magnetic memory cell junctions than within another of the aligned magnetic memory cell junctions.

4. The circuit of claim 2, wherein the conductive line is adapted to induce a magnetic field exclusively around one or more magnetic memory cell junctions of a single memory cell.

5. The circuit of claim 1, wherein the conductive line is vertically spaced from the magnetic memory cell junctions.

6. The circuit of claim 1, wherein the conductive line is arranged in electrical contact with the magnetic memory cell junctions.

7. The circuit of claim 1, further comprising a transistor adapted to enable current flow through the conductive line during a write operation of the memory array.

8. The circuit of claim 7, further comprising another transistor adapted to enable current flow from the conductive line through at least one of the magnetic memory cell junctions during a read operation of the memory array.

9. A memory array comprising a contiguous conductive line having:
   a first portion vertically aligned with one of a plurality of magnetic memory cell junctions arranged along a row of the memory array; and a second portion vertically aligned with another of the plurality of magnetic memory cell junctions, wherein the second portion is positioned such that a direction of current flow through the second portion is different than a direction of current flow through the first portion.

10. The memory array of claim 9, wherein the direction of current flow through the second portion is at an angle less than or equal to approximately 180° relative to the direction of current flow through the first portion.

11. The memory array of claim 10, wherein the direction of current flow through the second portion is at an angle between approximately 60° and approximately 120° relative to the direction of current flow through the first portion.

12. The memory array of claim 11, wherein the direction of current flow through the second portion is approximately 90° relative to the direction of current flow through the first portion.

13. The memory array of claim 9, wherein the first portion is positioned such that the direction of current flow through the first portion is arranged between easy and hard axes of the magnetic memory cell junction aligned with the first portion.

14. The memory array of claim 13, wherein the second portion is positioned such that the direction of current flow through the second portion is arranged between easy and hard axes of the magnetic memory cell junction aligned with the second portion.

15. The memory array of claim 9, wherein the contiguous conductive line is adapted to set the magnetic memory cell junction vertically aligned with the first portion in a different logic state than the magnetic memory cell junction vertically aligned with the second portion.

16. The memory array of claim 9, wherein the conductive line is adapted to induce a magnetic field around less than all of the magnetic memory junctions arranged along the row of the array.

17. The memory array of claim 9, wherein the memory array is adapted to selectively enable current to flow from a single source line to the contiguous conductive line and one or more additional conductive lines arranged within the array.

18. A method for operating a magnetic memory array comprising flowing current in alignment with a dimension of the magnetic memory array and adjacent to less than all of the magnetic memory cell junctions arranged along a row or a column of the array aligned with the dimension during a write operation of the array.

19. The method of claim 18, further comprising enabling the current flow from a source line to a conductive line aligned with the row or column of the array by applying voltage to a gate of a transistor coupled to the conductive line.

20. The method of claim 19, further comprising applying voltage to the gate of another transistor of the memory array during a read operation of the array.

* * * * *